United States Patent
Dudesek et al.

(10) Patent No.: US 8,970,324 B2
(45) Date of Patent: Mar. 3, 2015

(54) MULTILAYER COMPONENT AND PRODUCTION METHOD

(75) Inventors: Pavol Dudesek, Bad Gams (AT); Guenter Pudmich, Koeflach (AT); Hannes Schiechl, Graz (AT); Edmund Payr, Graz (AT); Thomas Feichtinger, Graz (AT); Werner Salz, Seoul (KR); Christian Hoffmann, Deutschlandsberg (AT)

(73) Assignee: Epcos AG, Munich (DE)

( * ) Notice: Subject to any disclaimer, the term of this patent is extended or adjusted under 35 U.S.C. 154(b) by 796 days.

(21) Appl. No.: 13/201,173

(22) PCT Filed: Feb. 8, 2010

(86) PCT No.: PCT/EP2010/051518
§ 371 (c)(1),
(2), (4) Date: Oct. 14, 2011

(87) PCT Pub. No.: WO2010/092027
PCT Pub. Date: Aug. 19, 2010

(65) Prior Publication Data
US 2012/0032757 A1 Feb. 9, 2012

(30) Foreign Application Priority Data

Feb. 12, 2009 (DE) .................. 10 2009 008 737
Mar. 24, 2009 (DE) .................. 10 2009 014 542

(51) Int. Cl.
*H01G 4/12* (2006.01)
*H01C 7/18* (2006.01)
(Continued)

(52) U.S. Cl.
CPC .............. *H01G 4/1209* (2013.01); *H01C 7/18* (2013.01); *B32B 18/00* (2013.01); *C04B 35/453* (2013.01);
(Continued)

(58) Field of Classification Search
CPC ................ H01G 4/1209; H03H 2001/0085
USPC ............ 333/172, 185; 501/134, 135; 428/336
See application file for complete search history.

(56) References Cited

U.S. PATENT DOCUMENTS

| 7,816,293 B2 | 10/2010 | Dudesek et al. |
| 2003/0004051 A1 | 1/2003 | Kim et al. |

(Continued)

FOREIGN PATENT DOCUMENTS

| DE | 10 2006 000 935 A1 | 7/2007 |
| DE | 10 2006 024 231 A1 | 11/2007 |

(Continued)

OTHER PUBLICATIONS

Shen et al.; "Dielectric Properties of $Bi_2O_3$—$ZnO$—$Ta_2O_5$ ceramics sintered by microwave"; Springer Science + Business Media, LLC pp. 448-451; Aug. 2007.*

*Primary Examiner* — Benny Lee
*Assistant Examiner* — Rakesh Patel
(74) *Attorney, Agent, or Firm* — Slater & Matsil, L.L.P.

(57) ABSTRACT

A multilayer component includes a dielectric ceramic material that can be co-sintered with a varistor ceramic to form a monolithic multilayer component according to the invention. The multilayer component therefore includes a layer of a varistor ceramic and another layer of a dielectric. Both layers can be arranged directly adjacent to one another in the multilayer component. In the multilayer component, metallizations are arranged on or between the ceramic layers. The metallizations are structured to form conductor sections and metallized areas. The metallizations form together with the ceramic layers alongside a varistor at least one further component selected from at least one of the component functions.

26 Claims, 2 Drawing Sheets

(51) Int. Cl.
*B32B 18/00* (2006.01)
*C04B 35/453* (2006.01)
*C04B 35/495* (2006.01)
*H03H 1/00* (2006.01)

(52) U.S. Cl.
CPC ...... *C04B 35/495* (2013.01); *H03H 2001/0085* (2013.01); *C04B 2235/3241* (2013.01); *C04B 2235/3251* (2013.01); *C04B 2235/3275* (2013.01); *C04B 2235/3279* (2013.01); *C04B 2235/3284* (2013.01); *C04B 2235/3294* (2013.01); *C04B 2235/3298* (2013.01); *C04B 2237/34* (2013.01); *C04B 2237/345* (2013.01)
USPC .......................................... 333/185; 501/135

(56) References Cited

U.S. PATENT DOCUMENTS

2009/0035560 A1  2/2009  Block et al.
2009/0155624 A1  6/2009  Dudesek et al.
2009/0165499 A1* 7/2009  Wei et al. ...................... 65/17.2

FOREIGN PATENT DOCUMENTS

JP  01-183803 A   7/1989
TW  200804227 A   1/2008

\* cited by examiner

MULTILAYER COMPONENT AND PRODUCTION METHOD

This patent application is a national phase filing under section 371 of PCT/EP2010/051518, filed Feb. 8, 2010, which claims the priority of German patent application 10 2009 008 737.0, filed Feb. 12, 2009, and German patent application 10 2009 014 542.7, filed Mar. 24, 2009, each of which is incorporated herein by reference in its entirety.

TECHNICAL FIELD

The invention relates to a ceramic multilayer component comprising a varistor and to the production of the component.

BACKGROUND

Discrete components having a varistor function can be used as protective components against ESD (electrostatic discharge). One possible use arises e.g. in radio-frequency filters for mobile radio, for example, in the frequency range of 0.5-5 GHz for the protection of these filters or for the protection of electronics connected downstream or upstream such as signal amplifiers, for example.

Alongside the protection function against ESD, these components can at the same time also ensure a protection function against EMI. A so-called EMI-ESD protective component is thus involved.

One of the most important properties of varistors is the so-called reverse current, which also flows below an overvoltage that is to be conducted away between the varistor electrodes. An excessively high reverse current would lead to a limitation of the functionality; particularly in the case of portable devices, such as a mobile phone, for example, it would lead to excessively rapid rechargeable battery discharge. Furthermore, it is necessary to ensure sufficient stability of the electrical properties during the lifetime of the component and in particular of the device into which the component is incorporated.

Particularly in the case of portable devices, a miniaturization of the components used and in particular an integration of different component functions in a common component are striven for. However, it has not been possible heretofore to integrate varistors into monolithic ceramic multilayer components without having to accept excessively high degradation of the electrical properties of the varistor in the process. Varistor ceramics are sensitive to diffusion with respect to the composition and have therefore not been able hitherto to be co-sintered together with other ceramics in sintered fashion to form a monolithic component.

German patent document DE 102 006000935 A1 discloses a method by which ceramic functional layers can be co-sintered together with tensioning layers on the basis of a glass ceramic with little warpage to form a monolithic multilayer component. An impermissible degradation of the varistor ceramic also occurs during sintering.

SUMMARY OF THE INVENTION

In one aspect, the present invention specifies a monolithic ceramic multilayer component in which at least one other component function is also integrated alongside a varistor function without the varistor functionality thereby being impermissibly impaired.

BRIEF DESCRIPTION OF THE DRAWINGS

The invention is explained in more detail below on the basis of exemplary embodiments and with reference to the associated figures. The figures are only schematic and not true to scale. Individual elements may be illustrated with distorted scale for improved clarity, and so neither absolute nor relative quantitative indications can be inferred from the figures.

DETAILED DESCRIPTION OF ILLUSTRATIVE EMBODIMENTS

Figure 1:
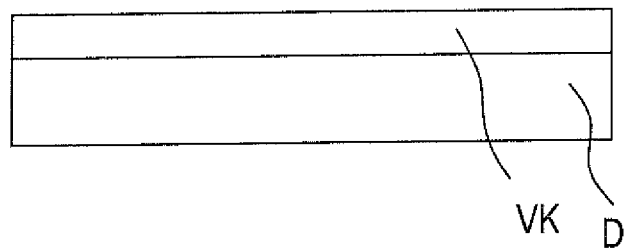
FIG. 1 shows a first monolithic layer assemblage with two layers.

A dielectric ceramic material has been found which can be co-sintered with a varistor ceramic to form a monolithic multilayer component according to the invention. The multilayer component therefore comprises at least one layer of a varistor ceramic and another layer of a dielectric. Both layers can be arranged directly adjacent to one another in the multilayer component. During sintering, at best an interdiffusion that is delimited to a narrow reaction zone of typically 1 μm between the two layers takes place between the layers, by which the electrical properties of the varistor are impaired insignificantly in the worst case. The critical varistor properties such as low reverse current and high pulse stability are maintained in the multilayer component.

In the multilayer component, metallizations are arranged on or between the ceramic layers, the metallizations being structured to form conductor sections and metallized areas. The metallizations form together with the ceramic, besides a varistor, at least one further component selected from at least one of the component functions capacitance, resistance and inductance.

The inner metallizations are introduced before sintering. Metallizations are arranged on outer layers or side surfaces and can also be produced or applied after the sintering of the multilayer component. Conductor sections and metallized areas which are arranged in different planes of the multilayer component can be electrically connected to one another by vias through one or more layers. Consequently, in the multilayer component, all integrated individual components can be electrically interconnected with one another and together produce a functional circuit, e.g., an RF filter circuit.

The monolithic integration of diverse component functions, which is made possible according to the invention, enables space- and cost-saving components to be produced.

The dielectric consists of different quantitative proportions of the following three stoichiometric compounds:

$Zn_3TaO_8$, $Zn_2TaO_6$ and $Bi_2Zn_{2/3}Ta_{4/3}O_7$.

The mixture contains at least one of said compounds.

In a further configuration, individual ions can be replaced in part stoichiometrically in the compounds. Thus, the Zn can be replaced in part by one or more of Ni, Co, Fe, Cu, Mg and Ca. Advantageously, Zn is replaced to the extent of at most approximately 30 atom % by one or more of the ions. Zn can also be replaced to the extent of 100% by Ca and Mg.

Ta can be replaced in part by Nb. Compounds in which only a relatively small portion of the Ta is replaced are preferred, however. With too much Nb there is the risk in an individual case of the sintering temperature becoming too low and the diffusion becoming too great.

The Bi can be replaced in part by one or more rare earths selected, in particular, from La and Nd.

Advantageously, Bi is replaced to the extent of at most approximately 30 atom % by one or more of the ions.

With the possible substitutions, a composition in accordance with the following empirical formula arises for the dielectric:

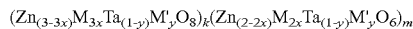

$(Zn_{(3-3x)}M_{3x}Ta_{(1-y)}M'_yO_8)_k(Zn_{(2-2x)}M_{2x}Ta_{(1-y)}M'_yO_6)_m$

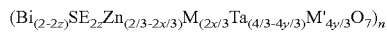

$(Bi_{(2-2z)}SE_{2z}Zn_{(2/3-2x/3)}M_{(2x/3)}Ta_{(4/3-4y/3)}M'_{4y/3}O_7)_n$

In this empirical formula, for the sum of the indices indicating the compound proportions of the pure phases, k+n+m=1 holds true, and the following holds true in the formula for each index k, m, n independently of one another: $0 \le k, m, n \le 1$. This formula does not yet take account of the fact that up to 5 percent by weight of a component which adapts the shrinkage behavior during sintering can be added to the dielectric.

In the empirical formula, M denotes Ni, Co or Ca. M' denotes Nb or Sb. SE denotes one or more rare earths. For each index x, y and z, which, in each case normalized to 1, indicates the proportion of the ions respectively replaced relative to the starting compound, the following holds true independently of one another: $0 \le x,y,z<1$. This means that not all proportions of the starting ions are replaced, or even none at all.

Advantageously, as already mentioned above, x and z are restricted to max. 0.3 and y is restricted to max. 0.5.

In the sintered dielectric of the multilayer component, corresponding separated pure phases and a ternary mixed phase can be observed depending on the precise composition of the three compounds used. Cubic structural units can also be formed.

The varistor ceramic can be based on the basis of a doped zinc oxide. The latter can be doped to the extent of in each case approximately 3-5 atom % with Bi and Sb as the main dopant. At least one of Ni, Co and Cr can also be contained as secondary dopants in a proportion of up to approximately 0.5 atom %.

It has been found that varistor ceramics on the basis of doped zinc oxide and praseodymium oxide are also compatible with the dielectric and can likewise be sintered together with the proposed dielectric without significant restriction of the varistor functionality.

A dielectric constant of approximately 400 arises for the varistor ceramic. The dielectric constant of the dielectric is generally between 20 and 100 and thus lower by a factor of 5 to 10. For the component functions that can be realized therefrom this results in a wide selection range with which practically all expedient values can be set for the component functions. By comparison with a pure varistor ceramic, which, in principle, can also be solely used as a dielectric, the variability in the design of circuits is thus significantly increased and therefore improved.

In the monolithic block, the structured metallizations which form the integrated L and C elements can be arranged on one and both sides adjacent to a layer of the dielectric and use the latter as a dielectric. However, components which utilize the varistor ceramic as a dielectric can also be formed in the multilayer component.

The multilayer component requires a sintering temperature of 950-1300° C. Therefore, only correspondingly resistant metals and alloys are appropriate as electrode materials for the metallizations. The metallizations can be produced from a conductive paste whose metallic constituents comprise, e.g., Ag/Pd alloy or Au. Pure silver is not suitable owing to the high sintering temperature.

In the multilayer component, the layers comprising the varistor ceramic and the dielectric can be arranged directly adjacent to one another or one above another in the stack of the multilayer component. A multilayer component can have a sandwich construction, in which there is arranged between two layers of identical type of the varistor ceramic or of the dielectric a respective other layer of the dielectric or of the varistor ceramic, wherein the layers in the sandwich construction are arranged one directly above another.

The multilayer component can also contain one or more further foreign layers composed of other materials as partial layers, if they are precluded from being in direct contact with the varistor ceramic.

Diverse passive components can be integrated in the multilayer component, wherein R and C, L and C, or R, L and C elements are also integrated alongside a varistor.

In the multilayer component, an RF filter circuit composed of R, C or L elements can be formed in integrated fashion in the monolithic block, wherein the varistor as a protective component can be connected in parallel with the RF filter circuit with respect to earth. In this circuit arrangement, the varistor fulfills two functions as ESD and EMI protection. By means of its varistor function, it can harmlessly conduct away harmful current pulses such as are typical of ESD. On the other hand, owing to its design, a varistor generally also has a capacitance. With a capacitance in a parallel branch with respect to earth, it therefore fulfills a rudimentary filter function with a stop band. By means of suitable dimensioning or by means of a suitably chosen capacitance value of the varistor, the stop band can be chosen or set in a suitable manner. The varistor can therefore also function as an EMI protective component.

A method for producing a multilayer component is additionally specified, in which use is made of starting materials which contain the ions of the corresponding later ceramic in the correct stoichiometric ratio, usually oxides or other salts that can be converted into oxides. These are mixed as homogeneously as possible, in particular by grinding. The grinding can be followed by a calcination step and renewed grinding. The homogeneously mixed starting materials are used to produce, with the aid of a binder, preferably an organic material of corresponding viscosity, first green sheets for the layer(s) composed of varistor ceramic and second green sheets for the dielectric, for example, by sheet casting.

After the green sheets have been dried, the metallizations are printed onto the green sheets on one and both sides with a sinterable conductive paste, for example, by means of screen printing. Afterwards, at least respectively one first and second green sheet are placed one above another, aligned with respect to the metallizations and laminated together to form a sheet assemblage. The sheet assemblage is then sintered together.

Vias are stamped into the green sheets at corresponding locations provided for plated-through holes and are filled with a conductive material before the sheets are laminated to form the sheet assemblage.

FIG. 1 shows a monolithic layer assemblage of a multilayer component with two layers one layer comprising a varistor ceramic VK and another layer comprising a dielectric D. For the sake of clarity, no metallizations or components that form them are illustrated. All component functions R, L and C and also the varistor can be realized with such metallizations, which can be arranged on or between the layers. Usually, external contacts are provided on one of the outwardly facing surfaces of one of the layers, in particular the dielectric, by means of which external contacts the multilayer component and the interconnection contained therein can be connected to the outside world, in particular a circuit environment, e.g., a PCB.

Figure 2:
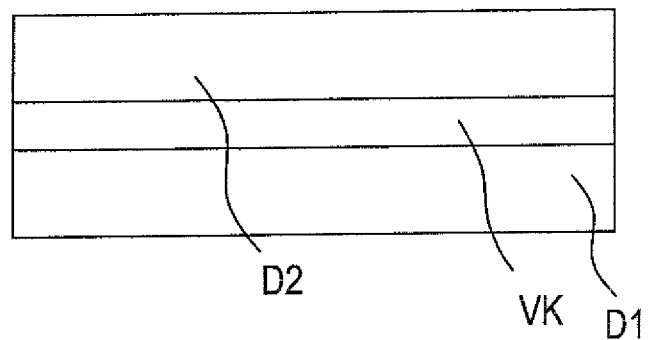
FIG. 2 shows a second monolithic layer assemblage composed of three layers.

FIG. 2 shows a monolithic layer assemblage of a multilayer component with at least three alternating layers a first layer of a dielectric D1, a layer of a varistor ceramic VK and a second layer of a dielectric D2.

Figure 3:
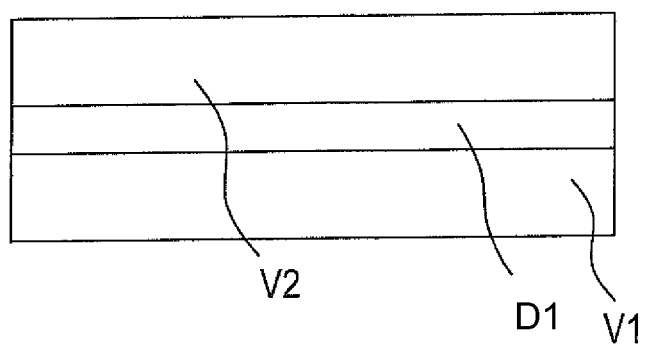
FIG. 3 shows a third monolithic layer assemblage composed of three layers with an inverted arrangement relative to FIG. 2.

FIG. 3 likewise shows a monolithic layer assemblage of a multilayer component with at least three alternating layers: a first layer of a varistor ceramic V1, a layer of a dielectric D1 and a second layer of a varistor ceramic V2.

Figure 4:
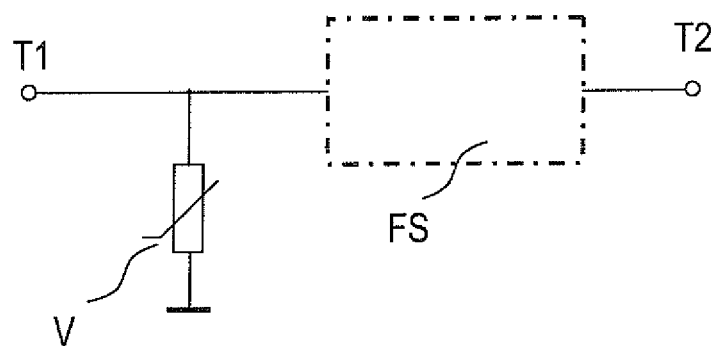
FIG. 4 shows an equivalent circuit diagram for a functional circuit integrated in the multilayer component.

FIG. 4 shows an equivalent circuit diagram for a functional circuit integrated in the multilayer component. A serial signal path comprising a filter circuit FS is connected between a first and a second terminal T1, T2. The filter circuit is embodied, e.g., using LC technology or some other technology that can be integrated into a ceramic multilayer component. A transverse branch is connected in parallel with the signal path with respect to earth, a varistor V being arranged in the transverse branch. In this case, the varistor can function with its varistor function as an ESD protective component and with its filter function as an EMI protective component.

Figure 5:
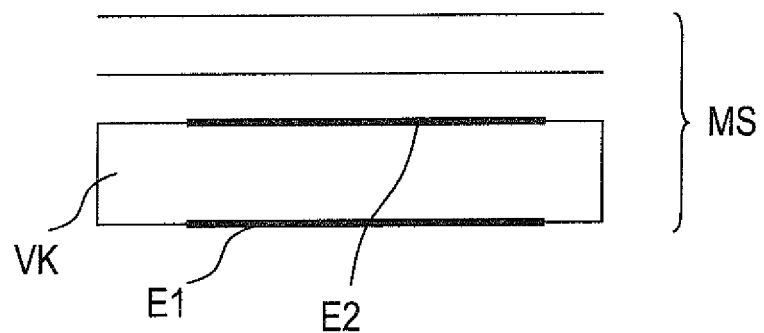
FIG. 5 shows a multilayer component with a varistor in cross section.

FIG. 5 shows a layer of varistor ceramic VK with a simple exemplary metallization that can be used to produce a varistor V. For this purpose, mutually overlapping electrodes E1 and E2 in the form of a baked conductive paste are formed at the top and bottom on the layer of the varistor ceramic VK. It is evident that this varistor V forms an appreciable capacitance. The further layers of the multilayer construction MS of the multilayer component are indicated by further lines.

Figure 6:
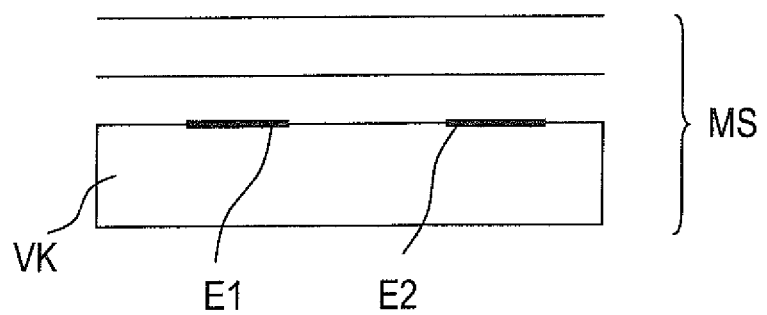
FIG. 6 shows a multilayer component with a variant of a varistor in cross section.

FIG. 6 shows a layer of varistor ceramic VK with an exemplary metallization that can be used to produce a varistor V. Electrodes E1 and E2 in the form of a baked conductive paste are formed at the top and/or at the bottom on the layer of the varistor ceramic VK in a manner spaced apart from one another but on the same layer surface. It is evident that this varistor V does not form an appreciable capacitance. The multilayer construction MS can comprise further layers indicated by further lines.

Figure 7:
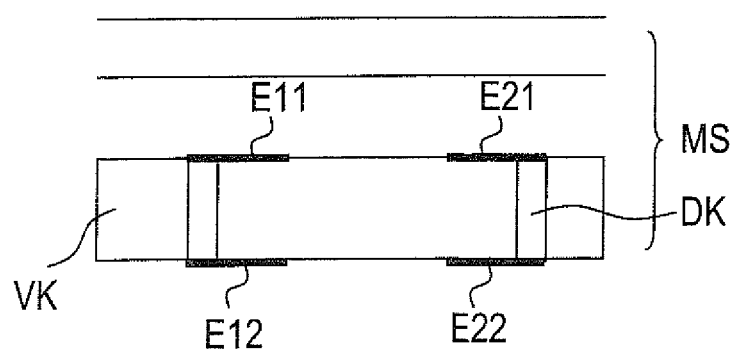
FIG. 7 shows a multilayer component with a further variant of a varistor in cross section.

FIG. 7 shows a layer of varistor ceramic VK with an exemplary metallization which can be used to produce a varistor V. In each case two electrodes E11 and E21, and E12 and E22, respectively, in the form of a baked conductive paste are formed at the top and at the bottom on the layer of the varistor ceramic VK in a manner spaced apart from one another on a respective layer surface. Metallizations E11 and E21, and E12 and E22, respectively, associated with the same electrode are connected to one another by a plated-through hole DK. The varistor functionality can now take effect at two electrode pairs.

It holds true for all embodiments of the multilayer component that each layer can comprise a plurality of partial layers of identical type between which respectively structured metallizations are arranged. Thus, in particular for the at least one varistor V or a capacitor, it is possible to form comb-like electrodes standing vertically with respect to the layer planes, as is already indicated, e.g., in FIG. 7 for a comb electrode with two "teeth". With in particular interdigitally intermeshed comb electrodes it is possible to realize high capacitance values for a capacitor or a varistor.

The invention claimed is:

1. A ceramic multilayer component, comprising:
a first layer comprising a varistor ceramic;
a second layer comprising a dielectric, the first and second layers being sintered to form a monolithic block; and
metallizations arranged on or between the first and second layers, the metallizations being structured to form conductor sections and metallized areas;
a varistor realized by the metallizations and the first layer and at least one further component comprising a capacitance, a resistance or an inductance realized by the metallizations and the second layer,
wherein a proportion of at least 95 percent by weight of the dielectric has a composition $(Zn_{(3-3x)}M_{3x}Ta_{(1-y)}M'_yO_8)_k(Zn_{(2-2x)}M_{2x}Ta_{(1-y)}M'_yO_6)_m(Bi_{(2-2z)}SE_{2z}Zn_{(2/3-2x/3)}M_{(2x/3)}Ta_{(4/3-4y/3)}M'_{4y/3}O_7)_n$,
wherein the sum k+n+m=1 and wherein the following holds true for each index k, m, n independently of one another:
$0<k, m, n<1$
wherein M denotes Ni, Co, Fe, Cu, Mg or Ca,
wherein M' denotes Nb or Sb, and
wherein SE denotes one or more rare earths,
wherein the following holds true for each index x, y and z independently of one another: $0 \leq x, y, z<1$, and
wherein, for the case where the proportion of the dielectric is less than 100%, the missing proportions up to 100% comprise a component for adapting shrinkage behavior.

2. The multilayer component according to claim 1, wherein the varistor ceramic is based on a doped zinc oxide.

3. The multilayer component according to claim 2, wherein the varistor ceramic contains dopants in a proportion of in each dopant 2-3 atom %, the dopants comprising Bi and Sb.

4. The multilayer component according to claim 2, wherein the varistor ceramic contains dopants in a respective proportion up to 0.5 atom %, wherein the dopants comprise Ni, Co or Cr.

5. The multilayer component according to claim 1, wherein the metallizations are formed from sintered conductive paste and comprise silver and palladium.

6. The multilayer component according to claim 1, wherein the first layer and the second layer are arranged one directly above another.

7. The multilayer component according to claim 1, wherein the multilayer component has a sandwich construction, that further comprises a third layer of a second varistor ceramic or a second dielectric, wherein the first, second and third layers in the sandwich construction are arranged one directly above another.

8. The multilayer component according to claim 1, wherein passive components are integrated in the multilayer component.

9. The multilayer component according to claim 8, wherein the at least one further component comprises an RF filter circuit comprising the resistance, the capacitance, or the inductance formed in integrated fashion in the monolithic block, and wherein the varistor serves as a protective component and is coupled in parallel with the RF filter circuit with respect to ground.

10. The multilayer component according to claim 8, wherein the at least one further component comprises the resistance and the capacitance; the inductance and the capacitance; or the resistance, the inductance, and the capacitance integrated adjacent the varistor.

11. The multilayer component according to claim 1, wherein, in the monolithic block, the structured metallizations form the integrated inductance and capacitance that are arranged on sides adjacent to the second layer of the dielectric.

12. The multilayer component according to claim 11, wherein the dielectric has a dielectric constant of between 15 and 100.

13. The multilayer component according to claim 1, wherein the Zn component comprises no less than 70 atom % of Zn, and the remaining atom % is at least one of Ni, Co, Fe, Cu, Mg or Ca.

14. The multilayer component according to claim 1, wherein k, n, m, x, y and z are all non-zero values.

15. The multilayer component according to claim 1, further comprising a third layer comprising a second dielectric, the first layer arranged between the second layer and the third layer.

16. The multilayer component according to claim 1, further comprising a third layer comprising a second varistor ceramic, the second layer arranged between the first layer and the third layer.

17. A ceramic multilayer component, comprising:
a first layer comprising a varistor ceramic, wherein the varistor ceramic is based on a doped zinc oxide and wherein the varistor ceramic contains dopants in a proportion of in each dopant 2-3 atom %, the dopants comprising Bi and Sb;
a second layer comprising a dielectric, the first and second layers being sintered to form a monolithic block; and
metallizations arranged on or between the first and second layers, the metallizations being structured to form conductor sections and metallized areas;
a varistor realized by the metallizations and the first layer and at least one further component comprising a capacitance, a resistance or an inductance realized by the metallizations and the second layer,
wherein a proportion of at least 95 percent by weight of the dielectric has a composition $(Zn_{(3-3x)}M_{3x}Ta_{(1-y)}M'_yO_8)_k (Zn_{(2-2x)}M_{2x}Ta_{(1-y)}M'_yO_6)_m(Bi_{(2-2z)}SE_{2z}Zn_{(2/3-2x/3)}M_{(2x/3)}Ta_{(4/3-4y/3)}M'_{4y/3}O_7)_n$,
wherein the sum k+n+m=1 and wherein the following holds true for each index k, m, n independently of one another:
0≤k, m, n≤1
wherein M denotes Ni, Co, Fe, Cu, Mg or Ca,
wherein M' denotes Nb or Sb, and
wherein SE denotes one or more rare earths,
wherein the following holds true for each index x, y and z independently of one another: 0≤x, y, z<1, and
wherein, for the case where the proportion of the dielectric is less than 100%, the missing proportions up to 100% comprise a component for adapting shrinkage behavior.

18. A ceramic multilayer component, comprising:
a first layer comprising a varistor ceramic, wherein the varistor ceramic is based on a doped zinc oxide and wherein the varistor ceramic contains dopants in a respective proportion up to 0.5 atom %, wherein the dopants comprise Ni, Co or Cr;
a second layer comprising a dielectric, the first and second layers being sintered to form a monolithic block; and
metallizations arranged on or between the first and second layers, the metallizations being structured to form conductor sections and metallized areas;
a varistor realized by the metallizations and the first layer and at least one further component comprising a capacitance, a resistance or an inductance realized by the metallizations and the second layer,
wherein a proportion of at least 95 percent by weight of the dielectric has a composition $(Zn_{(3-3x)}M_{3x}Ta_{(1-y)}M'_yO_8)_k (Zn_{(2-2x)}M_{2x}Ta_{(1-y)}M'_yO_6)_m(Bi_{(2-2z)}SE_{2z}Zn_{(2/3-2x/3)}M_{(2x/3)}Ta_{(4/3-4y/3)}M'_{4y/3}O_7)_n$,
wherein the sum k+n+m=1 and wherein the following holds true for each index k, m, n independently of one another:
0≤k, m, n≤1
wherein M denotes Ni, Co, Fe, Cu, Mg or Ca,
wherein M' denotes Nb or Sb, and
wherein SE denotes one or more rare earths,
wherein the following holds true for each index x, y and z independently of one another: 0≤x, y, z<1, and
wherein, for the case where the proportion of the dielectric is less than 100%, the missing proportions up to 100% comprise a component for adapting shrinkage behavior.

19. A ceramic multilayer component, comprising:
a first layer comprising a varistor ceramic;
a second layer comprising a dielectric, the first and second layers being sintered to form a monolithic block; and
metallizations arranged on or between the first and second layers, the metallizations being structured to form conductor sections and metallized areas;
a varistor realized by the metallizations and the first layer and at least one further component comprising a capacitance, a resistance or an inductance realized by the metallizations and the second layer,
wherein a proportion of at least 95 percent by weight of the dielectric has a composition $(Zn_{(3-3x)}M_{3x}Ta_{(1-y)}M'_yO_8)_k (Zn_{(2-2x)}M_{2x}Ta_{(1-y)}M'_yO_6)_m(Bi_{(2-2z)}SE_{2z}Zn_{(2/3-2x/3)}M_{(2x/3)}Ta_{(4/3-4y/3)}M'_{4y/3}O_7)_n$,
wherein the sum k+n+m=1 and wherein the following holds true for each index k, m, n independently of one another:
0≤k, m, n≤1
wherein M denotes Ni, Co, Fe, Cu, Mg or Ca,
wherein M' denotes Nb or Sb, and
wherein SE denotes one or more rare earths,
wherein the following holds true for each index x, y and z independently of one another: 0≤x, y, z<1, wherein k, n, m, x, y and z are all greater than zero, and
wherein, for the case where the proportion of the dielectric is less than 100%, the missing proportions up to 100% comprise a component for adapting shrinkage behavior.

20. A method for producing a multilayer component, the method comprising:
providing first green sheets containing starting materials for a varistor ceramic and second green sheets containing starting materials for a dielectric;
printing metallizations onto one of two sides of the first and second green sheets, the metallizations printed with a sinterable conductive paste;
placing at least one of the first green sheets and at least one of the second green sheets one above another, aligned with respect to the metallizations and laminated together to form a sheet assemblage; and
sintering the sheet assemblage to form a monolithic block;
wherein the monolithic block includes a varistor and at least one further component comprising a capacitance, a resistance or an inductance;
wherein a proportion of at least 95 percent by weight of the dielectric has a composition $(Zn_{(3-3x)}M_{3x}Ta_{(1-y)}M'_yO_8)_k (Zn_{(2-2x)}M_{2x}Ta_{(1-y)}M'_yO_6)_m(Bi_{(2-2z)}SE_{2z}Zn_{(2/3-2x/3)}M_{(2x/3)}Ta_{(4/3-4y/3)}M'_{4y/3}O_7)_n$;
wherein k+n+m=1 and wherein 0<k, m, n<1;
wherein M denotes Ni, Co, Fe, Cu, Mg or Ca;
wherein M' denotes Nb or Sb;

wherein SE denotes one or more rare earths; and
wherein the following holds true for each index x, y and z independently of one another: $0 \leq x, y, z < 1$.

21. The method according to claim 20, wherein, for the case where the proportion of the dielectric is less than 100%, the missing proportions up to 100% comprises a component for adapting the shrinkage behavior.

22. The method according to claim 20, further comprising stamping vias for plated-through holes into the first and second green sheets and filling the vias with a conductive material before the first and second green sheets are laminated to form the sheet assemblage.

23. The method according to claim 20, wherein the second green sheets are produced by using the starting materials in the form of metal oxides in a desired stoichiometric ratio and homogeneously mixing the starting materials by grinding.

24. The method according to claim 23, wherein the starting materials are calcined after grinding and before production of the first and second green sheets and are subsequently ground once again.

25. A dielectric material having a composition
$(Zn_{(3-3x)}M_{3x}Ta_{(1-y)}M'_{y}O_{8})_{k}(Zn_{(2-2x)}M_{2x}Ta_{(1-y)}M'_{y}O_{6})_{m}(Bi_{(2-2z)}SE_{2z}Zn_{(2/3-2x/3)}M_{(2x/3)}Ta_{(4/3-4y/3)}M'_{4y/3}O_{7})_{n}$,
where $k+n+m=1$,
where $0<k$,
where $0<m$,
where $0<n<1$,
where M denotes Ni, Co, Fe, Cu, Mg or Ca,
where M' denotes Nb or Sb, and
wherein SE denotes one or more rare earths, and
where $0 \leq x$,
where $0 \leq y$, and
where $z<1$.

26. The dielectric material of claim 25, wherein:
$0<x$,
$0<y$, and
$0<z<1$.

* * * * *